United States Patent [19]
Brewster et al.

[11] Patent Number: 5,980,307
[45] Date of Patent: Nov. 9, 1999

[54] STRAIN RELIEF SYSTEM FOR HOLDING CABLES TO CIRCUIT BOARDS

[75] Inventors: Terri L. Brewster, Rio Rico, Ariz.; Rupert J. Fry, Mount Prospect; Daniel M. Palmieri, Bloomingdale, both of Ill.

[73] Assignee: Molex Incorporated, Lisle, Ill.

[21] Appl. No.: 08/898,739

[22] Filed: Jul. 23, 1997

[51] Int. Cl.⁶ .................................................. H01R 9/07
[52] U.S. Cl. ............................................................ 439/493
[58] Field of Search .................................. 439/493, 595, 439/744

[56] References Cited

U.S. PATENT DOCUMENTS

| | | | |
|---|---|---|---|
| 3,497,923 | 3/1970 | Seckerson | 24/81 |
| 4,139,727 | 2/1979 | Kuballa | 174/68.5 |
| 4,611,868 | 9/1986 | Matsui et al. | 339/59 |
| 4,719,321 | 1/1988 | Kozel et al. | 174/135 |
| 4,797,112 | 1/1989 | Weisenburger | 439/55 |
| 4,955,814 | 9/1990 | Christie et al. | 439/77 |
| 5,181,854 | 1/1993 | Masuda | 439/493 |
| 5,186,651 | 2/1993 | Fuchs | 439/493 |
| 5,344,338 | 9/1994 | Colleran et al. | 439/465 |
| 5,462,451 | 10/1995 | Yeh | 439/493 |

FOREIGN PATENT DOCUMENTS

| | | | |
|---|---|---|---|
| 631351 | 12/1994 | European Pat. Off. | H01R 23/66 |
| 3004072 | 8/1981 | Germany | H01R 9/09 |
| 3405126 | 2/1984 | Germany | H02G 15/007 |
| 2-37679 | 2/1990 | Japan | H01R 9/07 |
| 2-184211 | 7/1990 | Japan | H02G 3/22 |
| 2-224292 | 9/1990 | Japan | H05K 1/18 |
| 4-319275 | 11/1992 | Japan | H01R 23/66 |
| 2249882 | 5/1992 | United Kingdom | H01R 3/00 |

*Primary Examiner*—Neil Abrams
*Assistant Examiner*—Javaid Nasri
*Attorney, Agent, or Firm*—Stephen Z. Weiss

[57] ABSTRACT

A strain relief system is provided for holding an electrical cable to a printed circuit board. The system includes a flat flexible cable including a plurality of parallel conductors with insulation around the conductors and a web of insulation between adjacent conductors. The web has an opening therethrough. A cable retention clip is provided for holding the cable to the board. The clip includes a base engaged in the cable opening, and a boardlock leg projecting from the base into an appropriate mounting hole in the printed circuit board.

17 Claims, 2 Drawing Sheets

STRAIN RELIEF SYSTEM FOR HOLDING CABLES TO CIRCUIT BOARDS

FIELD OF THE INVENTION

This invention generally relates to the art of electrical connections and, particularly, to a strain relief system and retention clip for holding an electrical cable, such as a flat flexible or ribbon cable, to a printed circuit board.

BACKGROUND OF THE INVENTION

In order to electrically interconnect printed circuit boards to other electrical components, it is necessary to provide electrical connecting lines or cables which lead in and out of the boards. The cables may extend from one printed circuit board to another or from a printed circuit board to an electrical component. In many instances, the cable is a flat flexible cable having a plurality of generally parallel conductors with insulation disposed around and between the respective conductors. It is well known in the art to employ plug-in connectors mounted to the printed circuit board, with terminals of the connector electrically connected to circuit traces on the board. A cable then may be terminated to a second electrical connector which can be mated to the board-mounted connector. Connector assemblies of this type are employed when it is necessary to periodically separate the cable from the printed circuit board. Such connectors often are relatively expensive in a highly competitive industry and take up considerable "real estate" on the board when high density boards have become prevalent.

Therefore, whenever periodic disconnection of the cable from the circuit board is not necessary, the conductors of the cable are directly and permanently connected to the circuit traces on the board, as by solder connections. This direct connection of the cable to the circuit board can result in substantial cost savings and manufacturing efficiencies. The respective conductor leads of the cable can be soldered directly to the circuit traces on the board without having expensive and sizable mating connectors and terminals.

When electrical cables are connected directly to printed circuit boards, some form of strain relief protection is desirable so that the solder connections of the conductors to the circuit traces on the board will not be broken in the event of pulling on the cable. Various strain relief techniques have been used, but they tend to be relatively expensive or cumbersome. For example, electrical contacts may be placed on the conductors and locked into place on the circuit board. This is a rather expensive expedient. Strain relief clips or brackets have been used to hold the cable by means of various boardlocks. However, such clips or brackets most often are of a clamping type wherein they embrace or clamp the cable and, consequently, they require considerable "real estate" on the board just like the expensive mateable connectors.

The present invention is directed to providing a unique strain relief system and clip for holding an electrical cable to a printed circuit board in a very simple, very inexpensive and efficient manner.

SUMMARY OF THE INVENTION

An object, therefore, of the invention is to provide a new and improved strain relief system for holding an electrical cable to a printed circuit board.

Another object of the invention is to provide a new and improved cable retention clip for holding an electrical cable to a printed circuit board.

In the exemplary embodiment of the invention, a flat flexible cable includes a plurality of parallel conductors with insulation around the conductors and a web of insulation between adjacent conductors. The web has an opening therethrough. Generally, a cable retention clip holds the cable to the board. The clip is extremely simple and includes a base engaged in the opening in the cable insulation and a boardlock leg projecting into a mounting hole in the printed circuit board.

As disclosed herein, the cable retention clip includes a push tab to facilitate manual insertion of the clip into the cable and the board. The push tab also performs a dual function of providing a stop shoulder on an insertion side of the cable to define a limit position of insertion of the clip base into the cable opening. A detent on the clip base is sized for passing through the cable opening, but the detent projects outwardly from the base to prevent the clip from backing out of the opening.

The cable retention clip preferably is of a generally inverted U-shape, with the base forming the bight portion of the U-shape, and including a pair of the downwardly projecting boardlock legs on opposite sides of the cable for insertion into a pair of mounting holes in the printed circuit board. In assembly, one of the legs first is inserted through the cable opening followed by the base of the clip which becomes disposed in the opening. The distal ends of the pair of legs include outwardly projecting boardlock hooks which pass through the mounting holes in the printed circuit board and lock against an opposite side of the board.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
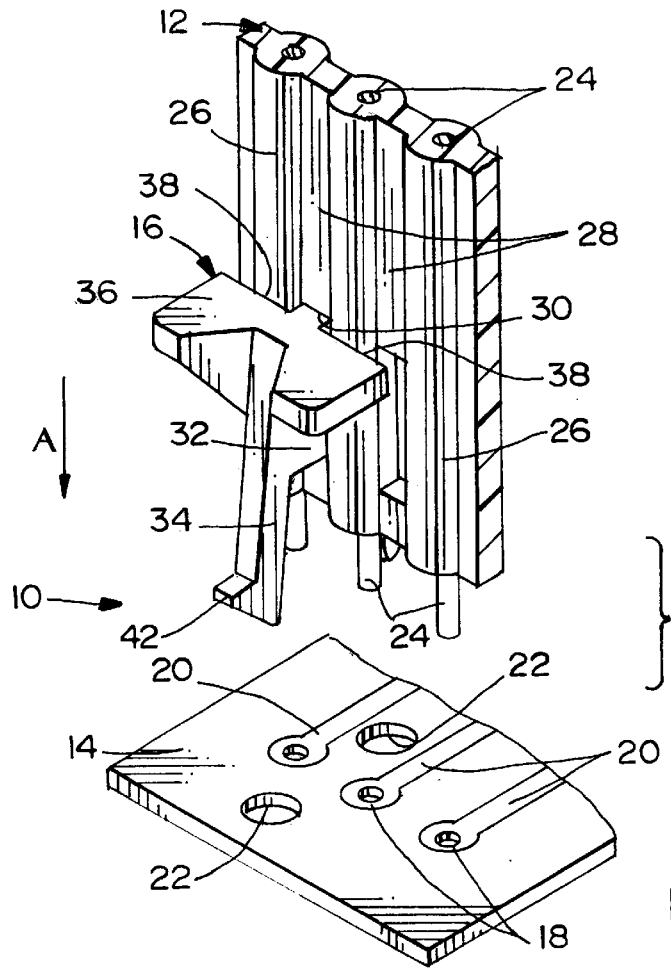
FIG. 1 is a perspective view of the strain relief system of the invention, including the flat flexible cable, the printed circuit board and the cable retention clip.

Referring to the drawings in greater detail, and first to FIG. 1, the strain relief system, generally designated 10, of the invention involves an electrical cable, generally designated 12, a printed circuit board 14 and one or more cable retention clips, generally designated 16. The cable clip is extremely simple and very inexpensive and provides strain relief for the cable both during assembly when conductors of the cable are soldered to circuit traces on the printed circuit board as well as during use to prevent damage or breakage to the solder connections when pulling stresses are created on the cable.

Printed circuit board 14 has a plurality of conductor-receiving holes 18 surrounded by circuit traces 20. The conductor-receiving holes are in a line on the board. A pair of mounting holes 22 are formed through the board substrate, with one mounting hole being on each opposite side of the line of conductor-receiving holes and in-between the circuit traces.

Figure 2:
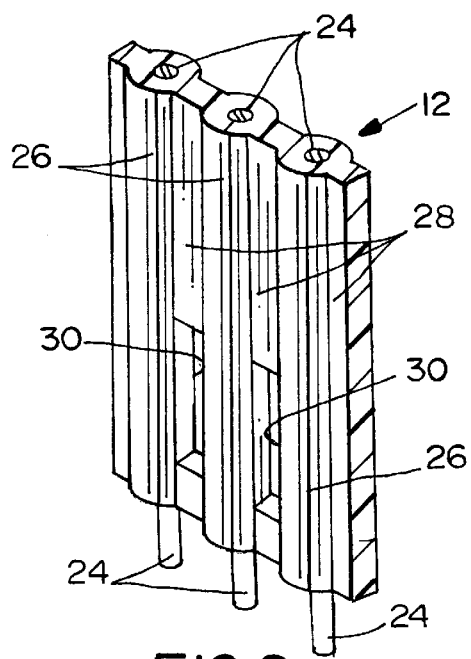
FIG. 2 is a perspective view of a distal end of the flat flexible cable with a pair of openings therethrough.

Referring to FIG. 2 in conjunction with FIG. 1, electrical cable 12 is a flat flexible cable having a plurality of parallel conductors 24. Flexible insulation 26 surrounds the conductors, and a unitary web 28 of the insulation is disposed between adjacent conductors. The conductors are inserted into cable-receiving holes 18 in printed circuit board 14 and soldered to circuit traces 20 on the board. The invention contemplates that one or more openings in the form of longitudinal slots 30 be formed in one or more of the webs 28 of the cable. FIG. 1 shows only one slot 30 for receiving cable retention clip 16. FIG. 2 shows that a number of slots can be formed in the cable to vary the position at which one or more of the clips can retain the cable. Although only one retention clip is shown for the cable in the drawings, it should be understood that more than one retention clip can be used for a single cable depending upon the width of the cable.

Figure 3A:
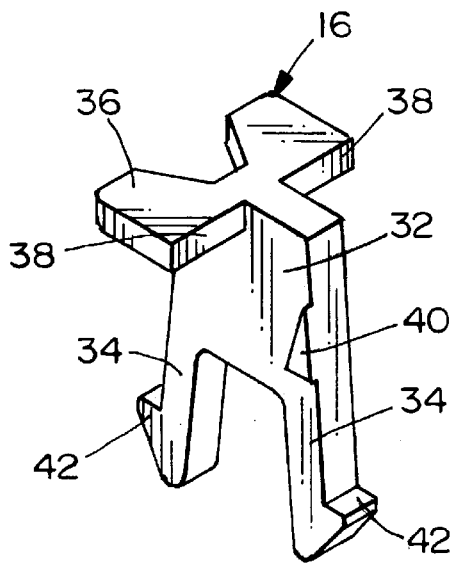
FIGS. 3A and 3B are perspective views of the cable retention clip.
Figure 3B:
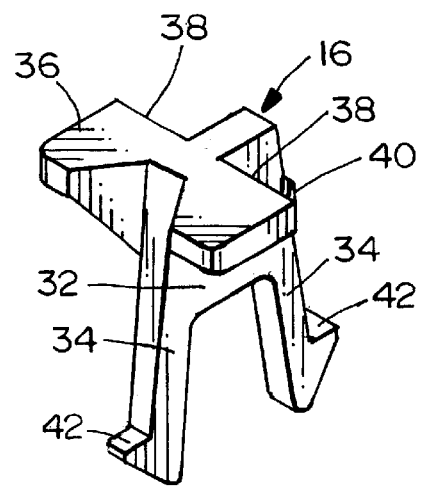
Figure 4:
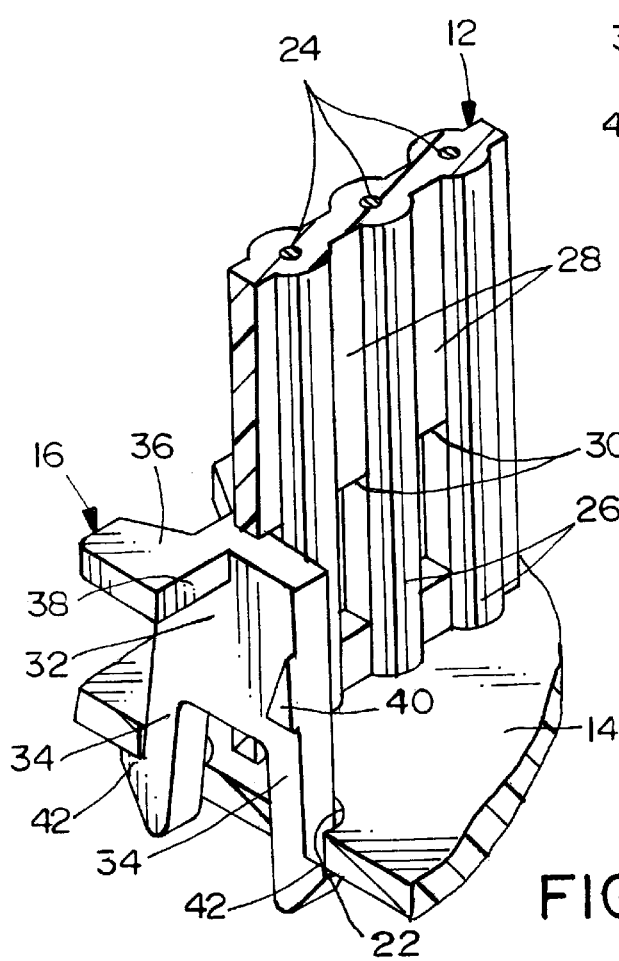
FIG. 4 is a cutaway perspective view through a portion of the cable and the circuit board, with one of the retention clips inserted into the board.

Referring to FIGS. 3A and 3B in conjunction with FIG. 1, each cable retention clip 16 includes a base 32 which becomes inserted into one of the slots 30 in the cable, and at least one boardlock leg 34 which projects into a respective one of the mounting holes 22 in the printed circuit board. Actually, the preferred embodiment of the clip is of a generally inverted U-shape, whereby base 32 joins a pair of depending boardlock legs 34, with the base defining the bight portion of the inverted U-shape. With this structure, when the clip is fully assembled through the cable and into the board as shown in FIG. 4, one boardlock leg 34 is provided on each opposite side of the cable to prevent the cable from "rocking" relative to the board both during a soldering process as well as during use.

Cable retention clip 16 is a unitary structure molded of dielectric material such as plastic or the like. The clip includes a number of useful features including a push tab 36 which is generally horizontal and projects from opposite sides of base 32. The push tab facilitates manual insertion of the clip into the cable and into the board. An inside surface 38 of the push tab defines a stop shoulder which abuts against one side of the cable as best shown in FIG. 1 to define a limit position of insertion of base 32 into opening 30 in the cable. A detent 40 is disposed on each opposite side of base 32 for passing through opening 30, but the detents project outwardly from the base to prevent the clip from accidentally backing out of the opening. In other words, when the clip is fully inserted through the opening in the cable, stop shoulder defined by inside surface 38 will be disposed against one side of the cable as seen in FIG. 1, and detents 40 will be disposed on the opposite side of the cable as seen in FIG. 4. Finally, the distal ends of boardlock legs 34 include outwardly projecting boardlock hooks 42 which pass through mounting holes 22 in the printed circuit board and lock against an opposite side of the board as seen in FIG. 4.

In operation, one or more of the cable retention clips 16 are inserted into one or more of the openings 30 in cable 12 as seen in FIG. 1. As stated above, when fully inserted, stop shoulder 38 is disposed against one side of the cable and detents 40 are disposed on the opposite side of the cable. Likewise, boardlock legs 34 are disposed in straddling position on opposite sides of the cable. This subassembly of the cable retention clip and the cable then is mounted to printed circuit board 14 by inserting the subassembly in the direction of arrow "A" (FIG. 1) into the board. During mounting or insertion, conductors 24 are inserted into conductor-receiving holes 18, and boardlock legs 34 are inserted into mounting holes 22. The full assembly is shown in FIG. 4, whereupon conductors 24 can be wave soldered to circuit traces 20 on the printed circuit board. Therefore, the cable retention clips stabilize the cable during processing. The clips also can remain in place to provide strain relief for the cable during use to prevent pulling stresses on the cable from damaging the solder connections.

From the foregoing, it can be understood that the strain relief system of the invention, including cable retention clip 16, provides a simple and inexpensive strain relief means with minimal board space required. The system can be used with any circuit size of ribbon cable (i.e. number of conductors 24), because multiple clips simply can be used when necessary. With the prior art, clamping clips had to be customized for the size of cable. Of course, the system eliminates board connectors. It can be seen in FIG. 4 that the cable sits directly on top of the printed circuit board, thereby minimizing the cable length. Detents 40 prevent the clip from falling out of the cable during handling as a subassembly as shown in FIG. 1. With boardlock legs 34 being disposed on both sides of the cable, the cable is prevented from rocking during soldering or other processes. In a miniaturized system, push tab 34 facilitates manual manipulation of the retention clip, and the push tab performs a dual function of providing a stop shoulder on the clip.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. A strain relief system for holding an electrical cable to a printed circuit board, comprising:

a flat flexible cable including a plurality of parallel conductors with insulation around the conductors and a web of insulation between adjacent conductors, the web having an opening therethrough;

a cable retention clip for holding the cable to the board, including a base engaged in said opening from one side of the cable and a first and second boardlock leg forming a pair of legs projecting from the base into an appropriate mounting hole in the printed circuit board, each leg located on opposite sides of the cable for insertion into respective first and second mounting holes in the printed circuit board one of said legs sized to pass through said opening in the web; and the base further including a detent sized for passing through the opening but projecting outwardly from the base contacting a side of the cable opposite the one side to prevent the clip from backing out of the opening.

2. The strain relief system of claim 1 wherein said cable retention clip includes a stop shoulder to define a limit position of insertion of the base into the opening.

3. The strain relief system of claim 1 wherein said cable retention clip includes a push tab to facilitate manual insertion of the clip into the cable and the board.

4. The strain relief system of claim 3 wherein said push tab includes a stop shoulder to define a limit position of insertion of the base into the opening.

5. The strain relief system of claim 1 wherein said cable retention clip is of a generally inverted U-shape, with the base joining the pair of boardlock legs to define the bight portion of a U-shape.

6. The strain relief system of claim 5 wherein the distal ends of said pair of boardlock legs include outwardly projecting boardlock hooks which pass through the mounting holes in the printed circuit board and lock against an opposite side of the board.

7. A strain relief system for holding an electrical cable to a printed circuit board, comprising:

a flat flexible cable including a plurality of parallel conductors with insulation around the conductors and a web of insulation between adjacent conductors, the web having an opening therethrough; and a generally inverted U-shaped cable retention clip for holding the cable to the board, including a base defining a bight portion of the U-shape with the base joining a pair of boardlock legs projecting into a pair of mounting holes in the printed circuit board on opposite sides of the cable, a stop shoulder for engaging one side of the cable to define a limit position of insertion of the base into the opening, one of said legs sized to pass though said opening in the web, and a detent for passing through the opening to the opposite side of the cable but projecting outwardly from the base contacting the opposite side of the cable to prevent the clip from backing out of the opening.

8. The strain relief system of claim 7 wherein said cable retention clip includes a push tab to facilitate manual insertion of the clip into the cable and the board.

9. The strain relief system of claim 8 wherein said push tab projects outwardly of the base and defines said stop shoulder.

10. The strain relief system of claim 7 wherein distal ends of said pair of boardlock legs include outwardly projecting boardlock hooks which pass through the mounting holes in the printed circuit board and lock against an opposite side of the board.

11. A cable retention clip for holding a flat flexible cable directly to a printed circuit board, the flat flexible cable including a plurality of parallel conductors with insulation around the conductors and a web of insulation between adjacent conductors, the web having an opening therethrough, comprising:

a base for engagement in the opening of the cable; and a pair of boardlock legs projecting from the base for insertion into a pair of mounting holes in the printed circuit board on opposite sides of the cable, one of said legs sized to pass through the opening in the web.

12. The cable retention clip of claim 11, including a stop shoulder for defining a limit position of insertion of the base into the opening.

13. The cable retention clip of claim 11, including a push tab to facilitate manual insertion of the clip into the cable and the board.

14. The cable retention clip of claim 13 wherein said push tab includes a stop shoulder to define a limit position of insertion of the base into the opening.

15. The cable retention clip of claim 11 wherein said base includes a detent sized for passing through the opening but projecting outwardly from the base to prevent the clip from backing out of the opening.

16. The cable retention clip of claim 11 wherein said cable retention clip is of a generally inverted U-shape, with the base joining the pair of boardlock legs to define the bight portion of the U-shape.

17. The cable retention clip of claim 16 wherein distal ends of said pair of boardlock legs include outwardly projecting boardlock hooks which pass through the mounting holes in the printed circuit board and lock against.

* * * * *